US006969898B1

(12) United States Patent
Exposito et al.

(10) Patent No.: US 6,969,898 B1
(45) Date of Patent: Nov. 29, 2005

(54) OPTICAL SEMICONDUCTOR HOUSING AND METHOD FOR MAKING SAME

(75) Inventors: Juan Exposito, St. Nazaire les Eymes (FR); Remi Brechignac, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/129,297

(22) PCT Filed: Oct. 30, 2000

(86) PCT No.: PCT/FR00/03021

§ 371 (c)(1),
(2), (4) Date: Oct. 28, 2002

(87) PCT Pub. No.: WO01/33636

PCT Pub. Date: May 10, 2001

(30) Foreign Application Priority Data

Nov. 4, 1999 (FR) .................................... 99 13777

(51) Int. Cl.[7] .................. H01L 31/0203; H01L 23/04; H01L 23/043; H01L 21/52
(52) U.S. Cl. ...................... 257/434; 257/680; 257/704; 257/723; 257/738; 257/777; 438/59; 438/65; 438/116
(58) Field of Search ............................. 257/433, 434, 257/680, 693, 697, 704, 723, 738, 777, 778; 438/59, 65, 108, 116

(56) References Cited

U.S. PATENT DOCUMENTS 5,436,492 A * 7/1995 Yamanaka ................. 257/433
5,932,875 A * 8/1999 Chung et al. .............. 250/239
6,429,047 B1 * 8/2002 Huang ....................... 438/108
6,649,991 B1 * 11/2003 Chen et al. ................ 257/433
6,686,667 B2 * 2/2004 Chen et al. ................ 257/787
2002/0096729 A1 * 7/2002 Tu et al. .................... 257/433

FOREIGN PATENT DOCUMENTS

JP          11261044 A  *  9/1999    ........... H01L 27/14

OTHER PUBLICATIONS

Nishida et al., "Semiconductor Device with Solid-State Image Sensing Element and Manufacture of this Semiconductor Device," English translation of Japanese patent application publication No. JP 11-261044 A, Sep. 1999.*

* cited by examiner

Primary Examiner—Stephen W. Smoot
(74) Attorney, Agent, or Firm—Lisa K. Jorgenson; Stephen Bongini; Fleit, Kain, Gibbons, Gutman, Bongini & Bianco P.L.

(57) ABSTRACT

Optical semiconductor package and its fabrication process, in which: a rear face of a first semiconductor component (3) such as a microprocessor is supported by a front face of an electrical connection support plate (1); a rear face of a second semiconductor component (11) is fixed to a front face of the said first component (3) and a front face of this second component has an optical sensor (13); first electrical connection means (6) connect the said first component to the front face of the said support plate; second electrical connection means (14) connect the said second component to the front face of the said support plate; means (17) ensure encapsulation of the said components stacked on the said support plate and of the said electrical connection means, the said encapsulation means being made from a transparent material which is opposite the said optical sensor; and external electrical connection means (24) are located on an exposed part of the said support plate.

25 Claims, 3 Drawing Sheets

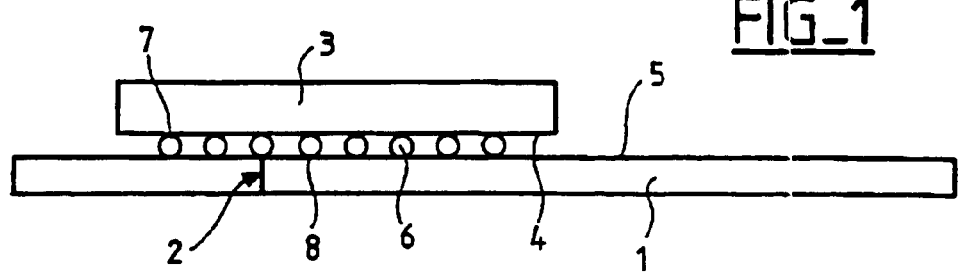
FIG_1
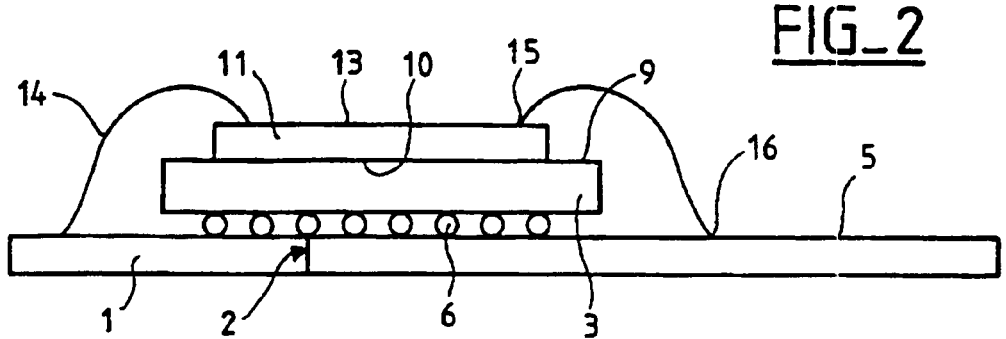
FIG_2
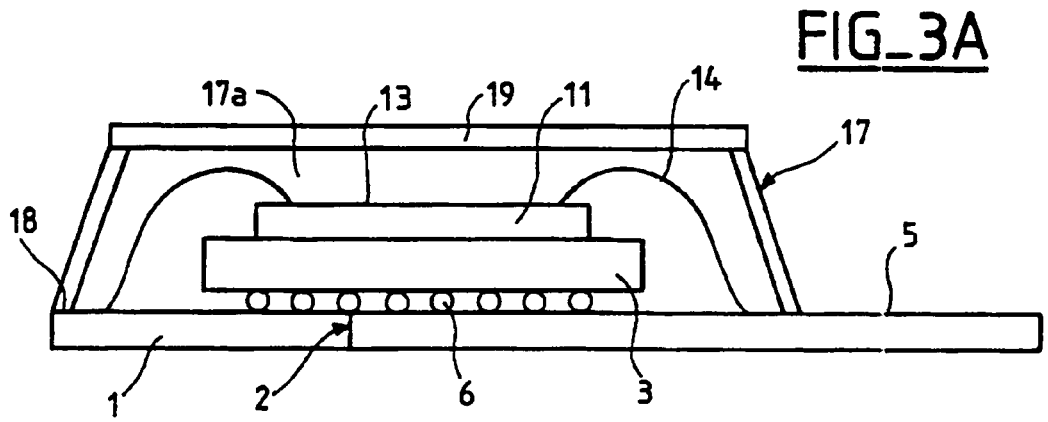
FIG_3A
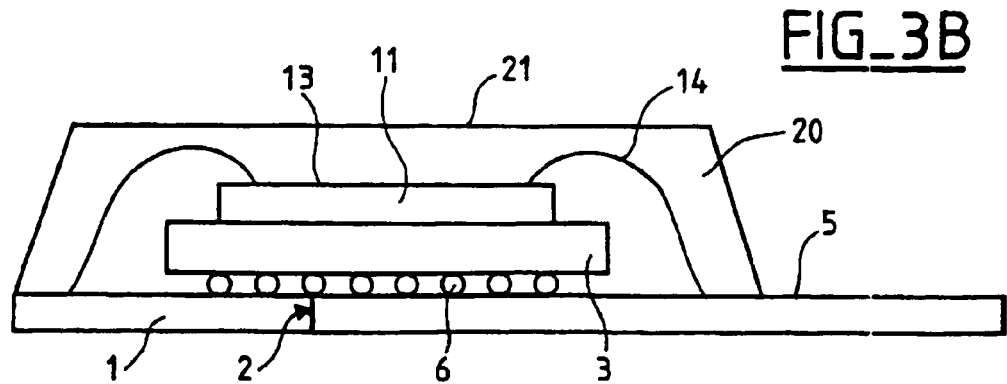
FIG_3B

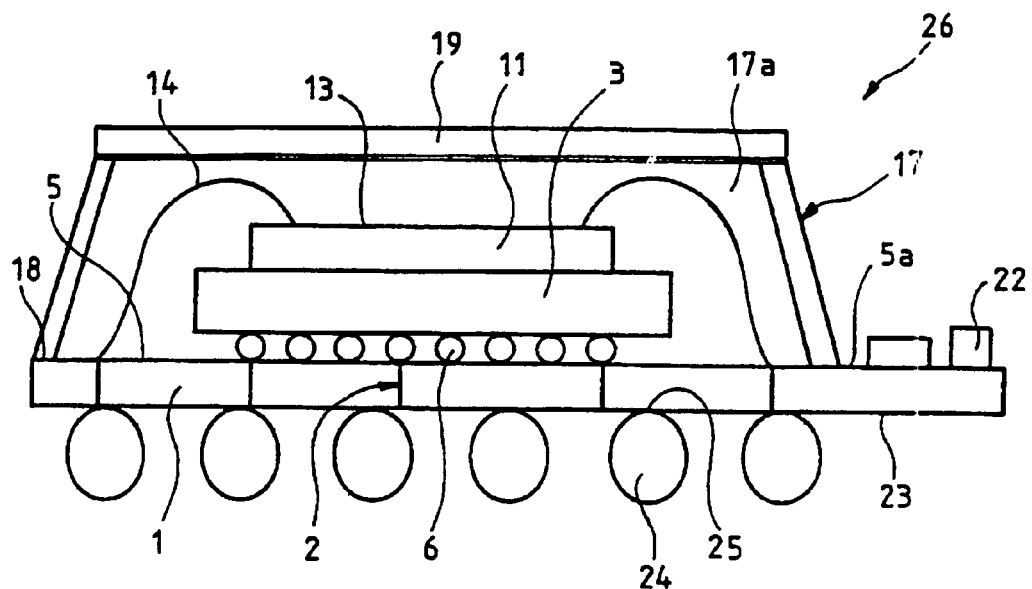
FIG_4A
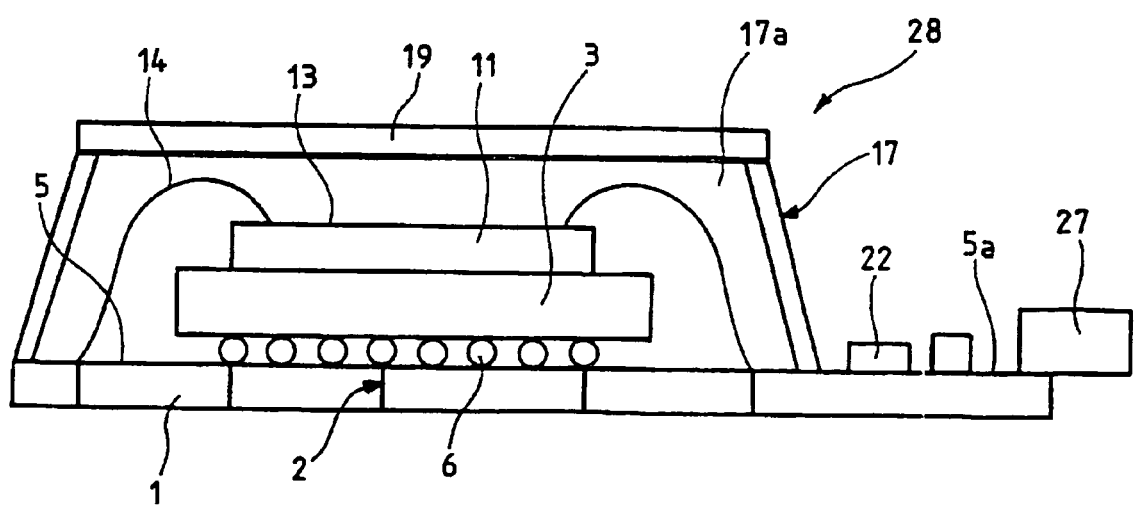
FIG_4B

FIG_5
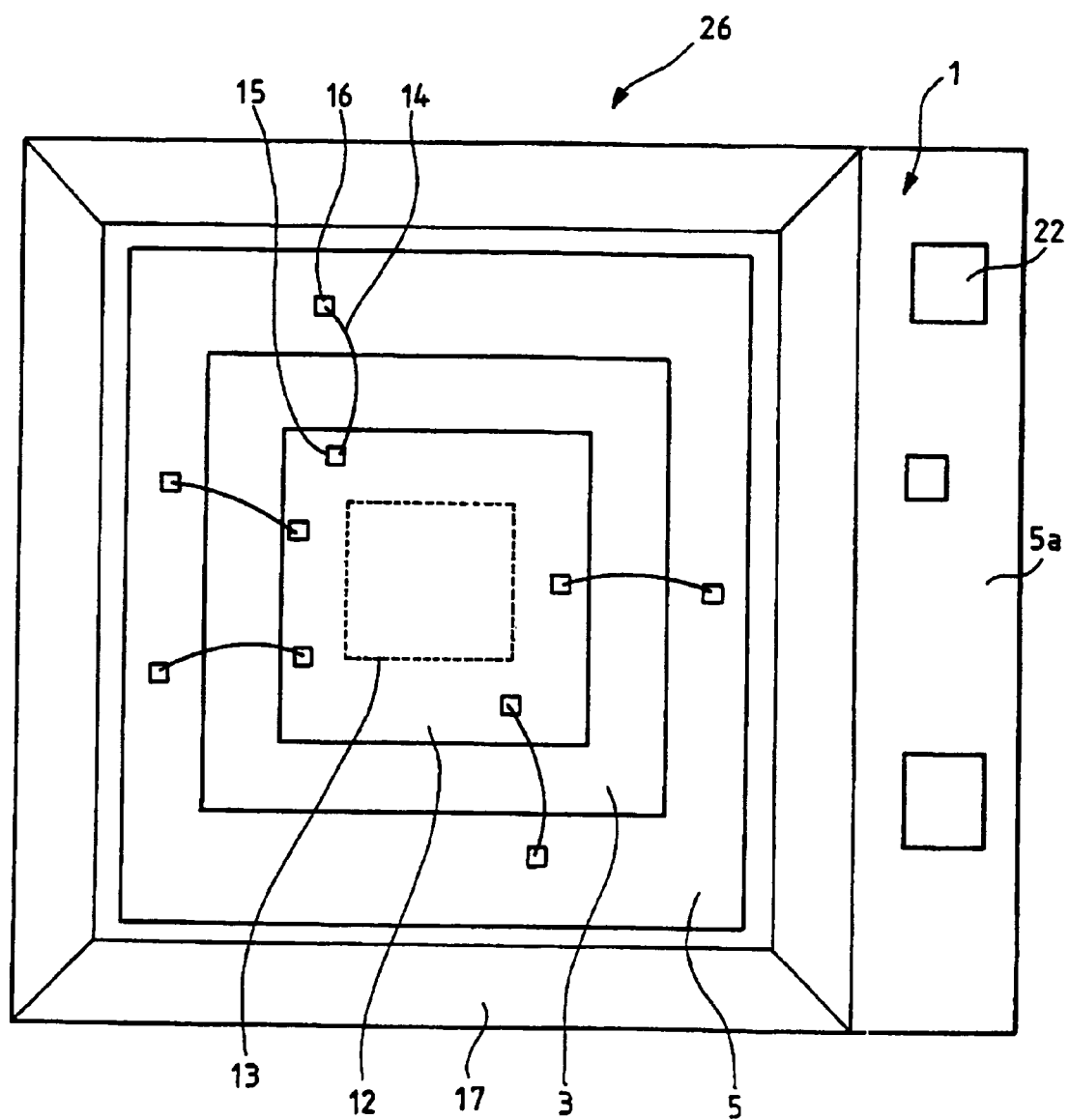

OPTICAL SEMICONDUCTOR HOUSING AND METHOD FOR MAKING SAME

The present invention relates to an optical semiconductor package and to a process for fabricating such a package.

The object of the present invention is to provide a structure for an optical semiconductor package comprising several semiconductor components and a process for fabricating such a package in such a way that this package has a small footprint and is capable of being used immediately, preferably to deliver image data from the data arising from a semiconductor component with an optical sensor.

According to one subject of the present invention, the optical semiconductor package comprises an electrical connection support plate; a first semiconductor component such as a microprocessor, a face of which is supported by a front face of the said support plate; a second semiconductor component, a front face of which has an optical sensor and a rear face of which is fixed to a front face of the said first component; first means for electrical connection of the said first component to the front face of the said support plate; second means for electrical connection of the said second component to the front face of the said support plate; means for encapsulation of the said components stacked on the said plate and of the said electrical connection means, said encapsulation means being made from a transparent material which is opposite the said optical sensor; and external electrical connection means located on an exposed part of the said support plate.

According to a preferred embodiment of the invention, the said first electrical connection means comprise electrical connection balls fixed and inserted between the rear face of the said first component and the front face of the said support plate.

According to a preferred embodiment of the invention, the said second electrical connection means comprise electrical connection wires whose ends are respectively connected, on one hand, to the front face of the said second component and, on the other hand, to the front face of the said support plate.

According to an alternative embodiment of the invention, the said encapsulation means comprise a dish-shaped lid covering, at some distance, the said components and the said electrical connection means of these components, the said lid being fixed to the said support plate and lid comprising a bottom which is at least partially transparent and which lies opposite the said optical sensor.

According to the invention, the peripheral edge of the said lid is preferably fixed to the said support plate with adhesive bonding.

According to another alternative embodiment of the invention, the said encapsulation means are made from a transparent encapsulation material.

According to a preferred embodiment of the invention, the said support plate supports passive electronic components which are electrically connected to it.

According to the invention, the said passive electronic components are preferably located outside the said encapsulation means.

According to an alternative embodiment of the invention, the said external electrical connection means comprise electrical connection balls located on the rear face of the said support plate opposite the said components.

According to another alternative embodiment of the invention, the said external electrical connection means comprise an electrical connection body fixed to the said support plate.

According to another subject of the present invention, the process for fabricating an optical semiconductor package comprises, successively, the following stages: fixing and electrically connecting a rear face of a first semiconductor component such as a microprocessor to a front face of an electrical connection support plate via electrical connection balls located between electrical connection regions of the said faces; fixing the rear face of a second semiconductor component, a front face of which has an optical sensor, to a front face of the said first component; fixing the ends of electrical connection wires between electrical connection regions of the front face of the said second component; encapsulating the said components stacked on the said support plate and encapsulating the said electrical connection means using a material which is at least partially transparent, and opposite the said optical sensor; and fixing external electrical connection means located on an exposed part of the said support plate.

According to the invention, the said encapsulation operation consists in fixing the edge of a dish-shaped lid to the said support plate, said lid covering the said components at some distance, and whose bottom is transparent and opposite the said optical sensor.

According to the invention, the said encapsulation operation consists in encapsulating the said components with a transparent encapsulation material.

According to the invention, the process may advantageously consist in fixing and electrically connecting passive electronic components to the said support plate.

According to an alternative embodiment of the invention, fixing external electrical connection means consists in depositing electrical connection balls on electrical connection regions provided on the rear face of the said support plate.

According to an alternative embodiment of the invention, fixing external electrical connection means consists in fixing at least one electrical connection body to electrical connection regions provided on the said support plate.

The present invention will be better understood by studying an optical semiconductor package and its fabrication process, these being described by way of non-limiting examples and illustrated by the drawings in which:

FIG. 1 shows a first stage in the fabrication of a package according to the present invention;

FIG. 2 shows a second stage in the fabrication of the said package;

FIG. 3A shows a third stage in the fabrication of the said package according to a first embodiment of the latter;

FIG. 3B shows a third stage in the fabrication of the said package according to a second embodiment of the latter;

FIG. 4A shows a fourth stage in the fabrication of the said package according to a first embodiment of the latter;

FIG. 4B shows a fourth stage in the fabrication of the said package according to a second embodiment of the latter; and FIG. 5 shows a top view of the package shown in FIG. 4A.

FIG. 1 shows a prefabricated substrate 1 made up of a support plate which has internal and/or external lines forming an electrical connection circuit 2 and a first semiconductor component 3 such as a microprocessor or coprocessor.

In a first stage in the fabrication, a rear face 4 of the first component 3 is fixed to a front face 5 of the support plate 1 via a number of metal balls 6 distributed in the form of an array. These balls 6 form electrical connections respectively between metal pads 7 and metal pads 8 made on the surface of the rear face 4 of the first component 3 and the front face 5 of the support plate 1.

FIG. 2 shows a second stage in the fabrication, in which the rear face 10 of a second optical semiconductor component 11 is fixed to the front face 9 of the first component 3 via a layer of adhesive or other fixing means, the front face 12 of the optical component 11 having an optical sensor 13 in its central part.

Next, one of the ends of electrical connection wires 14 is fixed to metal pads 15 formed on the surface of the front face 12 of the second component 11 around the optical sensor 13 and the other end of the electrical connection wires 14 is fixed to metal pads 16 of the circuit 2, these being formed on the surface of the front face 5 of the support plate 1 and at some distance from the periphery of the first component 3.

In a third stage in the fabrication shown in FIG. 3A, according to a first embodiment, encapsulation is carried out using, above and at some distance from the components 3 and 11 and from the electrical connection wires 14, a dish-shaped lid 17 which defines a cavity 17a, whose peripheral edge 18 is fixed to the front face 5 of the support plate 1 and whose bottom 19 lies parallel to this support plate at some distance from the optical sensor 13, and which is made from a transparent material. On three of its sides, the edge 18 of the lid 17 lies adjacent to the edge of the support plate 1 while its third side crosses the front face 5 of this support plate so as to leave a portion of this front face 5a exposed.

In a second embodiment shown in FIG. 3B, the aforementioned encapsulation is obtained by forming, on the front face 5 of the support plate 1, a block 20 made from a transparent encapsulation material whose front face 21 lies parallel to the support plate 1 and in front of the optical sensor 13.

In a fourth stage in the fabrication, according to a first embodiment shown in FIG. 4A, passive electronic components 22, such as resistors and/or capacitors, are fixed to the exposed part 5a of the front face 5 of the support plate 1, laterally with respect to the lid 17 or to the encapsulation block 20, these electronic components 22 being at the same time electrically connected to the circuit 2 of the support plate 1.

A number of external electrical connection metal balls 24 are fixed to metal pads 25 of the circuit 2, these pads being provided on the surface of a rear face 23 of the support plate 1 and distributed in the form of an array by depositing the said balls on the rear face 23 of the support plate 1.

In this way, as shown in FIGS. 4A and 5, a complete optical semiconductor package 26, fitted with an optical semiconductor component 11 and with various electronic processing components 3 and 22, is obtained, said components being electrically connected in an appropriate way via the connection circuit 2 of the support plate 1 and capable of being connected to an external circuit using the metal balls 24.

In the alternative embodiment shown in FIG. 4B, the external electrical connection metal balls 24 are replaced with an external electrical connection body or connector 27 fixed on the front face 5 of the support face 1, at the end of its exposed part 5a and connected to the circuit 2.

In this way, as shown in FIG. 4B, a complete optical semiconductor package 28 fitted with an optical semiconductor component 11 and with various electronic processing components 3 and 22 is obtained, the said components being electrically connected in an appropriate way via the connection circuit 2 of the support plate 1 and capable of being connected to an external circuit using the connector 27.

In an alternative embodiment, the aforementioned passive components could also be at least partially encapsulated.

The present invention is not limited to the examples described hereinbefore. Many alternative embodiments are possible without departing from the scope defined by the appended claims.

What is claimed is:

1. An optical semiconductor package comprising:
an electrical connection support plate;
a first semiconductor component having a rear face that is supported by a front face of the support plate;
a second semiconductor component having a front face with an optical sensor and a rear face that is fixed to a front face of the first component;
first connectors electrically connecting the first component to the front face of the support plate;
second connectors electrically connecting the second component to the front face of the support plate;
encapsulation encapsulating the first and second components and the first and second connectors, the encapsulation including a transparent material that is opposite the optical sensor; and
external connectors located on an exposed portion of the support plate,
wherein the encapsulation includes a block of transparent encapsulation material.

2. The semiconductor package as defined in claim 1, wherein the first semiconductor component is a microprocessor.

3. The semiconductor package as defined in claim 1, wherein the second connectors include electrical connection wires connected between the front face of the second component and the front face of the support plate.

4. The semiconductor package as defined in claim 1, wherein the first connectors include electrical connection balls that are fixed between the rear face of the first component and the front face of the support plate.

5. The semiconductor package as defined in claim 4, wherein the second connectors include electrical connection wires connected between the front face of the second component and the front face of the support plate.

6. The semiconductor package as defined in claim 1,
wherein the support plate also supports passive electronic components that are electrically connected to the support plate, and
the external connectors include electrical connection balls located on a rear face of the support plate.

7. The semiconductor package as defined in claim 1, wherein the external connectors include an electrical connection body that is fixed to the support plate.

8. An optical semiconductor package comprising:
an electrical connection support plate;
a first semiconductor component having a rear face that is supported by a front face of the support plate;
a second semiconductor component having a front face with an optical sensor and a rear face that is fixed to a front face of the first component;
first connectors electrically connecting the first component to the front face of the support plate;
second connectors electrically connecting the second component to the front face of the support plate;
encapsulation encapsulating the first and second components and the first and second connectors, the encapsulation including a transparent material that is opposite the optical sensor; and
external connectors located on an exposed portion of the support plate,
wherein the support plate also supports passive electronic components that are electrically connected to the support plate.

9. The semiconductor package as defined in claim 8, wherein the encapsulation includes a dish-shaped lid that covers the first and second components and the first and second connectors, the lid being fixed to the support plate and having an at least partially transparent bottom located opposite the optical sensor.

10. The semiconductor package as defined in claim 9, wherein a peripheral edge of the lid is adhesively bonded to the support plate.

11. The semiconductor package as defined in claim 8, wherein the passive electronic components are located outside the encapsulation.

12. The semiconductor package as defined in claim 8, wherein the external connectors include electrical connection balls located on a rear face of the support plate.

13. An information processing system including at least one optical semiconductor package, said semiconductor package comprising:
   an electrical connection support plate;
   a first semiconductor component having a rear face that is supported by a front face of the support plate;
   a second semiconductor component having a front face with an optical sensor and a rear face that is fixed to a front face of the first component;
   first connectors electrically connecting the first component to the front face of the support plate;
   second connectors electrically connecting the second component to the front face of the support plate;
   encapsulation encapsulating the first and second components and the first and second connectors, the encapsulation including a transparent material that is opposite the optical sensor; and
   external connectors located on an exposed portion of the support plate,
   wherein the encapsulation of the semiconductor package includes a block of transparent encapsulation material.

14. The information processing system as defined in claim 13, wherein the first connectors of the semiconductor package include electrical connection balls that are fixed between the rear face of the first component and the front face of the support plate.

15. The information processing system as defined in claim 13, wherein the second connectors of the semiconductor package include electrical connection wires connected between the front face of the second component and the front face of the support plate.

16. The information processing system as defined in claim 13, wherein the external connectors of the semiconductor package include electrical connection balls located on a rear face of the support plate.

17. An information processing system including at least one optical semiconductor package, said semiconductor package comprising:
   an electrical connection support plate;
   a first semiconductor component having a rear face that is supported by a front face of the support plate;
   a second semiconductor component having a front face with an optical sensor and a rear face that is fixed to a front face of the first component;
   first connectors electrically connecting the first component to the front face of the support plate;
   second connectors electrically connecting the second component to the front face of the support plate;
   encapsulation encapsulating the first and second components and the first and second connectors, the encapsulation including a transparent material that is opposite the optical sensor; and
   external connectors located on an exposed portion of the support plate,
   wherein the support plate of the semiconductor package also supports passive electronic components that are electrically connected to the support plate.

18. The information processing system as defined in claim 17, wherein the encapsulation of the semiconductor package includes a dish-shaped lid that covers the first and second components and the first and second connectors, the lid being fixed to the support plate and having an at least partially transparent bottom located opposite the optical sensor.

19. A method for fabricating an optical semiconductor package, said method comprising the steps of:
   fixing and electrically connecting a rear face of a first semiconductor component to a front face of an electrical connection support plate;
   fixing a rear face of a second semiconductor component, which has a front face with an optical sensor, to a front face of the first component;
   connecting the ends of electrical connection wires to electrical connection regions of the front face of the second component;
   encapsulating the first and second components and the electrical wires in a block of transparent encapsulation material; and
   fixing external connectors to an exposed portion of the support plate.

20. The method as defined in claim 19, wherein the first semiconductor component is electrically connected to the front face of the support plate via electrical connection balls that are located between electrical connection regions of the first semiconductor component and the support plate.

21. The method as defined in claim 19, wherein the step of fixing external connectors includes the sub-step of depositing electrical connection balls on electrical connection regions on a rear face of a support plate.

22. The method as defined in claim 19,
   wherein the step of fixing external connectors includes the sub-step of fixing at least one electrical connection body to the support plate.

23. A method for fabricating an optical semiconductor package, said method comprising the steps of:
   fixing and electrically connecting a rear face of a first semiconductor component to a front face of an electrical connection support plate;
   fixing a rear face of a second semiconductor component, which has a front face with an optical sensor, to a front face of the first component;
   connecting the ends of electrical connection wires to electrical connection regions of the front face of the second component;
   encapsulating the first and second components and the electrical wires using a structure that is at least partially transparent;
   fixing external connectors to an exposed portion of the support plate; and
   fixing and electrically connecting passive electronic components to the support plate.

24. The method as defined in claim 23, wherein the encapsulating step includes the sub-step of fixing a dish-shaped lid to the support plate so that the lid covers the first and second components at some distance, the bottom of the lid being transparent opposite the optical sensor.

25. The method as defined in claim 23, wherein the encapsulating step includes the sub-step of encapsulating the components in a block of transparent encapsulation material.

* * * * *